US007695811B2

(12) United States Patent
Northen et al.

(10) Patent No.: US 7,695,811 B2
(45) Date of Patent: Apr. 13, 2010

(54) ON/OFF REVERSIBLE ADHESIVE

(75) Inventors: Michael T. Northen, Santa Barbara, CA (US); Kimberly L. Turner, Goleta, CA (US)

(73) Assignee: The Regents of the University of California, Oakland, CA (US)

(*) Notice: Subject to any disclaimer, the term of this patent is extended or adjusted under 35 U.S.C. 154(b) by 455 days.

(21) Appl. No.: 11/688,161

(22) Filed: Mar. 19, 2007

(65) Prior Publication Data

US 2007/0251648 A1   Nov. 1, 2007

Related U.S. Application Data

(60) Provisional application No. 60/783,656, filed on Mar. 17, 2006.

(51) Int. Cl.
*D02G 3/00* (2006.01)

(52) U.S. Cl. .................. 428/343; 428/357; 428/364; 156/272.4; 977/724; 977/732; 977/762

(58) Field of Classification Search .............. 156/272.4; 428/343, 223, 357, 364; 977/724, 732, 734, 977/742–754, 762
See application file for complete search history.

(56) References Cited

U.S. PATENT DOCUMENTS

| | | | |
|---|---|---|---|
| 6,737,160 B1 | 5/2004 | Full et al. | |
| 7,181,811 B1* | 2/2007 | Tomanek et al. | 24/442 |
| 7,477,441 B1* | 1/2009 | Zhang et al. | 359/290 |
| 2005/0274454 A1* | 12/2005 | Extrand | 156/272.4 |
| 2006/0122596 A1* | 6/2006 | Dubrow | 606/60 |
| 2007/0064349 A1* | 3/2007 | Kasichainula | 360/324.1 |
| 2008/0280085 A1* | 11/2008 | Livne | 428/40.1 |

OTHER PUBLICATIONS

Google Scholar Search reports covering the inventors (4 separate documents).*
International Search Report mailed Dec. 18, 2007.
Arzt, E. et al., "From micro to nano contacts in biological attachment devices," PNAS, Sep. 16, 2003, pp. 10602-10606, vol. 100, No. 19.
Autumn, K. et al., "Adhesive force of a single gecko foot-hair," Nature, Jun. 8, 2000, pp. 681-685, vol. 405.
Autumn, K. et al., "Evidence for van der Waals adhesion in gecko setae," PNAS USA 99, Sep. 17, 2002, p. 12252.
Gao, H. et al., "Shape insensitive optimal adhesion of nanoscale fibrillar structures," PNAS, May 25, 2004, pp. 7851-7856, vol. 101, No. 21.
Gao, H. et al., "Mechanics of hierarchical adhesion structures of geckos," Mechanics of Materials, 2005, pp. 275-285, vol. 37.
Geim, A.K. et al., "Microfabricated adhesive mimicking gecko foot-hair," Nature Materials, Jul. 2003, pp. 461-463, vol. 2.

(Continued)

*Primary Examiner*—D. L Tarazano
*Assistant Examiner*—Matthew D Matzek
(74) *Attorney, Agent, or Firm*—Gates & Cooper LLP (57) ABSTRACT

An on/off reversible adhesive mechanism, and method for fabricating same. The adhesive mechanism is a hierarchical system comprised of a micro-scale compliant surface having one or more nano-structures thereon, wherein the compliant surface is moved by applying a magnetic field either to engage the nano-structures with an adhering surface or to remove the nano-structures from the adhering surface.

11 Claims, 6 Drawing Sheets

OTHER PUBLICATIONS

Glassmaker, N.J. et al., "Design of biomimetic fibrillar interfaces: 1. Making contact," J. R. Soc. Interface, 2004, pp. 23-33, vol. 1.

Huber, G. et al., "Evidence for capillarity contributions to gecko adhesion from single spatula nanomechanical measurements," PNAS, Nov. 8, 2005, pp. 16293-16296, vol. 102, No. 45.

Judy, J.W. et al., "Magnetic Microactuation of Polysilicon Flexure Structures," J. Microelectromechanical Systems, Dec. 1995, pp. 162-169, vol. 4, No. 4.

Northen, M.T. et al., "A batch fabricated biomimetic dry adhesive," Nanotechnology, 2005, pp. 1159-1166, vol. 16.

Persson, B.N.J. et al. "The effect of surface roughness on the adhesion of elastic plates with application to biological systems," J. of Chemical Physics, Dec. 1, 2003, pp. 11437-11444, vol. 119, No. 21.

Ruibal, R. et al., "The Structure of the Digital Setae of Lizards," J. Morph, 1965, pp. 271-294, vol. 117.

Sitti, M. et al., "Synthetic Gecko Foot-Hair Micro/Nano-Structures as Dry Adhesives," Appeared in J. Adhesion Sci. Technol., 2003, pp. 1055-1074, vol. 18, No. 7.

Spolenak, R. et al., "Adhesion design maps for bio-inspired attachment systems," Acta Biomaterialia, 2005, pp. 5-13, vol. 1.

Sun, W. et al., "The Nature of the Gecko Lizard Adhesive Force," Biophys. J., 2005, pp. L14-L17, vol. 89.

Williams, E.E., "Convergent and Alternative Designs in the Digital Adhesive Pads of Scincid Lizards," Science, Mar. 19, 1982, pp. 1509-1511, vol. 215, No. 4539.

* cited by examiner

ON/OFF REVERSIBLE ADHESIVE

CROSS-REFERENCE TO RELATED APPLICATION

This application claims the benefit under 35 U.S.C. Section 119(e) of the following co-pending and commonly-assigned U.S. patent application:

U.S. Provisional Patent Application Ser. No. 60/783,656, filed on Mar. 17, 2006, by Michael T. Northen and Kimberly L. Turner, entitled "ON/OFF REVERSIBLE ADHESIVE", which application is incorporated by reference herein.

STATEMENT REGARDING FEDERALLY SPONSORED RESEARCH AND DEVELOPMENT

This invention was made with Government support under Grant No. FA9550-05-1-0045 awarded by the AFOSR. The Government has certain rights in this invention.

BACKGROUND OF THE INVENTION

1. Field of the Invention

This invention is related to an on/off reversible adhesive and a method for fabricating same.

2. Description of the Related Art (Note: This application references a number of different publications as indicated throughout the specification by one or more reference numbers within parentheses, e.g., (x). A list of these different publications ordered according to these reference numbers can be found below in the section entitled "References." Each of these publications is incorporated by reference herein.)

The mechanism of adhesion in the gecko has been of scientific interest since Aristotle observed a gecko running up and down a tree (1). Recently there has been an intensifying scientific investigation into the fundamental physics of the adhesive, isolating van der Waals as the primary interaction (2, 3), with additional evidence that humidity contributes substantially to the adhesion (4, 5). Regardless of the fundamental interactions at the atomic scale, there is clearly a great deal of function contained in the hierarchical structure of the gecko's tarsus (6-12). The structure consists of 200 nm wide spatular termini at the ends of ~100 µm long, ~5 µm diameter setae, which extend from a compliant tarsal pad cushioned by blood sinuses (10-13). This fine splitting of the contacts into sub-micron elements on slender setae increases the van der Waals interaction with the surface, and allows easy deformation of the attachment system to accommodate rough surfaces (15). In addition, the gecko can increase the adhesion strength by prestressing (squeezing) opposite toes through muscular activation; this transforms some component of the normal force into a shear force, thus enhancing adhesion. There is evidence that the hierarchical structure may serve another purpose—to reduce adhesion, when needed (2, 14, 15).

Just as interesting as the gecko adhesion mechanism is the mechanism by which the gecko is able to release a surface. The specialized shape of the gecko's setae and spatulae allow the gecko to control adhesion through macroscopic movements of its toes. By hyperextension of its toe, the gecko peels its adhesive pads off the surface. This, in itself, aids in the detachment of the foot, just as peeling a piece of tape off of a surface is easier than trying to pull it off all at once. It has been shown theoretically (16) and experimentally (3) that the magnitude of setal adhesion is greatly dependent on the angle of applied pull-off force. Thus, when the gecko switches from a squeezing (adhesive) state to a peeling state, the adhesive force goes from a maximum to a minimum. This can also be seen at the nanoscale, as the applied force on the spatulae changes the interactions from a frictional regime to a peeling regime, greatly reducing the adhesion (6). Therefore, the design of its hierarchical attachment structure allows the gecko to control the adhesion from the macro-scale to nano-scale through macroscopic muscle movements.

Previously, a bio-inspired synthetic system enhancing adhesion utilizing a hierarchical structure was fabricated and tested (17). Prior work has focused on mimicking the terminal bristle component of the adhesive, by fabricating arrays of polymeric nanorods on a solid substrate (3, 20, 21). While individual nanorods demonstrated expected amounts of adhesion, larger arrays failed to produce larger amounts of adhesion, unless removed from the substrate and placed on a compliant backing (20), showing the need for multiscale compliance. In addition, unlike the gecko, the system did not provide a mechanism for decreasing adhesion. This attribute is critical to any application of such a biomimetic system.

SUMMARY OF THE INVENTION

The present invention discloses an on/off reversible adhesive comprising a compliant surface having one or more nano-structures thereon, wherein the compliant surface is moved by applying a magnetic field either to engage the nano-structures with an adhering surface or to remove the nano-structures from the adhering surface.

The compliant surface is a paddle situated at one end of a cantilever, or a platform supported by a pillar. The nano-structures are uncondensed, aligned, vertical, polymer nanorods.

The compliant surface changes shape to control adhesion. Specifically, the compliant surface is moved in order to control an amount of the compliant surface's area that is available for adhesion. Consequently, adhesion is enhanced or decreased by moving the compliant surface.

In one embodiment, an array of compliant surfaces having nano-structures thereon is constructed. The array comprises a microelectromechanical system (MEMS) device.

The present invention discloses a method for fabricating an adhesive comprising fabricating one or more nano-structures on a compliant surface, such that the nano-structures are positioned to an adhering surface or the nano-structures are removed from the adhering surface, when the compliant surface is moved by applying a magnetic field.

BRIEF DESCRIPTION OF THE DRAWINGS

Referring now to the drawings in which like reference numbers represent corresponding parts throughout:

FIGS. 1(a)-(d) are electron micrographs of released structures, wherein

FIGS. 2(a) and 2(b) show stereo micrographs of the adhesive, where FIG. 2(a) shows the adhesive in the 'ON' state, no applied magnetic field, with the adhesive paddles facing vertically, and FIG. 1(b) shows the adhesive in the 'OFF' state, with an applied magnetic field rotating the paddles sideways, concealing the adhesive faces, wherein the scale bars are 100 μm.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The present invention discloses a novel approach for micro- and nano-fabricating a synthetic analogue to the gecko adhesive system. The hierarchical micro-scale and nano-scale structures of the preferred embodiment comprises nano-structures such as nanorods coating a compliant surface of a micro-structure such as a compliant or flexible paddle or platform situated at one end of a cantilever, beam or pillar. The paddle and cantilever rotate when subjected to a magnetic field, wherein this rotation conceals the nanorods on the paddle's surface and greatly reduces the available surface area for adhesion.

Testing of the system showed reversible adhesion behavior switching from a μ' value ($F_{adhesion}/F_{preload}$) of greater than one (the largest reported value for a biomimetic system to date (19)) to a value less than the noise level in the instrumentation. Thus, an active hierarchical structure, inspired by the gecko, has been fabricated and demonstrated to display controlled and reversible adhesion.

A key point of the present invention is the use of a "fine hair" adhesive motif, resulting from the nanorods coating the compliant surface, to create a surface that switches adhesive properties. The future of reversible adhesives will very likely use this motif. In a more general sense, the present invention discloses a surface that reversibly changes shape to reversibly change the adhesion or other surface properties, such as hydrphobicity (which is useful for directing fluid flow), reflectivity (which is useful for changing how much light a surface adsorbs), etc.

Technical Description

FIGS. 1(a)-(d) are electron micrographs of released structures of the on/off reversible adhesive mechanism according the preferred embodiment of the present invention.

Figure 1A:
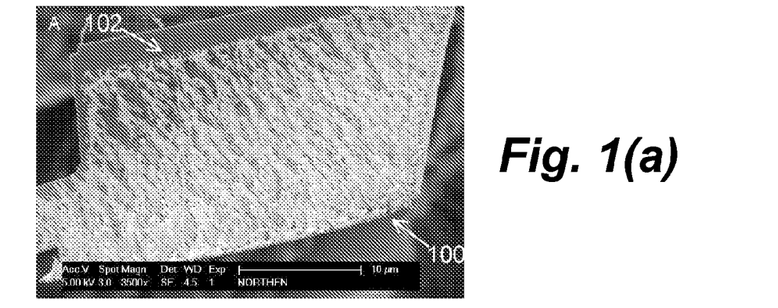
FIG. 1(a) is a paddle surface coated with evenly spaced uncondensed aligned vertical polymer nanorods (scale bar 10 µm)

FIG. 1(a) shows a compliant surface, for example, a paddle 100, having at least a portion thereof coated with one or more nano-structures, for example, evenly spaced, uncondensed, aligned, vertical, polymer nanorods 102, which provide the "fine hair" adhesive motif of the present invention. These nanorods 102 perform an adhesion function when engaged to or pressed against an adhering surface (not shown). Specifically, the compliant surface of the paddle 100 is moved by applying a magnetic field either to engage the nanorods 102 with an adhering surface or to remove the nanorods 102 from the adhering surface.

Figure 1B:
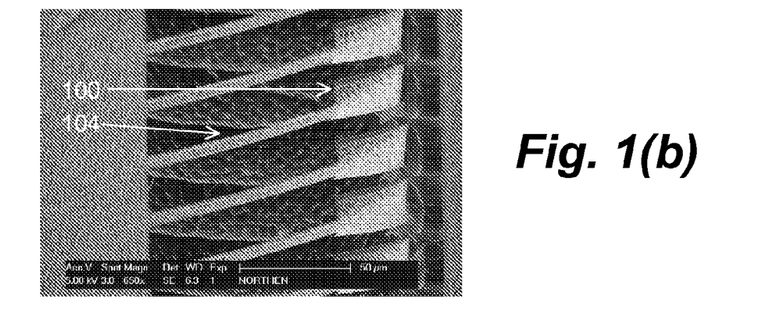
FIG. 1(b) shows freestanding nickel cantilevers and paddles coated with nanorods (scale bar 50 µm)

FIG. 1(b) shows that the compliant surface is a terminal paddle 100 situated at one end of a freestanding nickel cantilever 104. Alternatively, the compliant surfaces may be characterized as a platform supported by a pillar.

Figure 1C:
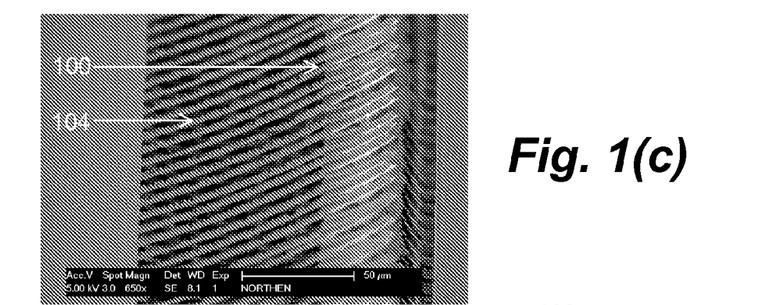
FIG. 1(c) is a low angle view of cantilevers showing upwards bending of the structures relative to the solid substrate (note the slight angle of the paddles causing a necessary slight misalignment with the magnetic field) (scale bar 50 µm)

FIG. 1(c) is a low angle view of the paddles 100 and cantilevers 104 showing the upwards bending of the structures relative to the solid substrate shown on the left hand side of the micrograph (note the slight angle of the paddles 100 causing a necessary slight misalignment with the magnetic field).

Figure 1D:
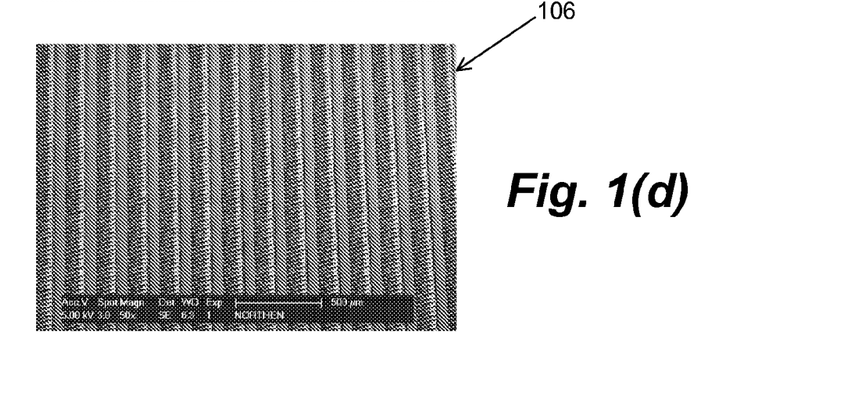
FIG. 1(d) is a lower magnification view of a portion of the array (scale bar 500 µm).

FIG. 1(d) is a lower magnification view of a portion of an array 106 of these structures, namely an array 106 of compliant surfaces having nano-structures thereon. In the preferred embodiment, the array of the compliant surfaces comprises a microelectromechanical system (MEMS) device. Each of the compliant surfaces is moved in order to control an amount of the compliant surface's area that is available for adhesion, i.e., adhesion is enhanced or decreased by moving the compliant surface. Preferably, each of the compliant surfaces is moved by applying a magnetic field, in such a manner that the compliant surface changes shape to control adhesion.

Just as the gecko uses its system to both increase and decrease adhesion, the present invention is fabricated to perform similar functions. Where the gecko uses muscle to actuate its attachment structure, the present invention uses a magnetic field to actuate the paddles 100 and cantilevers 104. The paddles 100 and cantilevers 104, when placed in a magnetic field, reorient themselves so that the paddles 100 and cantilevers 104, which are responsible for positioning the nanorods 102, rotate to face away from an adhering surface. This conformational change effectively switches off the structure's ability to adhere by drastically reducing the available adhesive area provided by the nanorods 102 relative to the adhering surface.

Figure 2A:
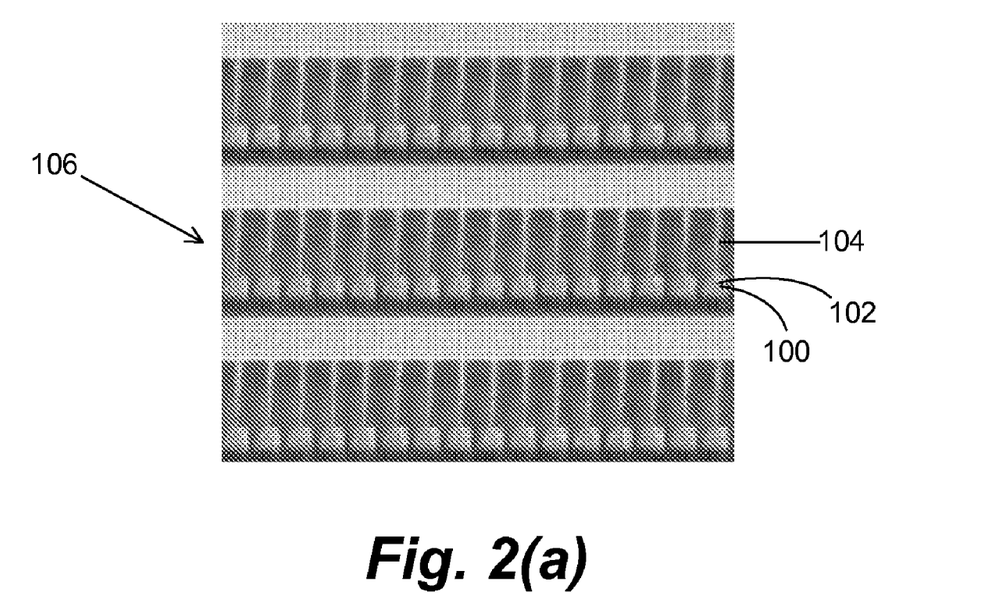
Figure 2B:
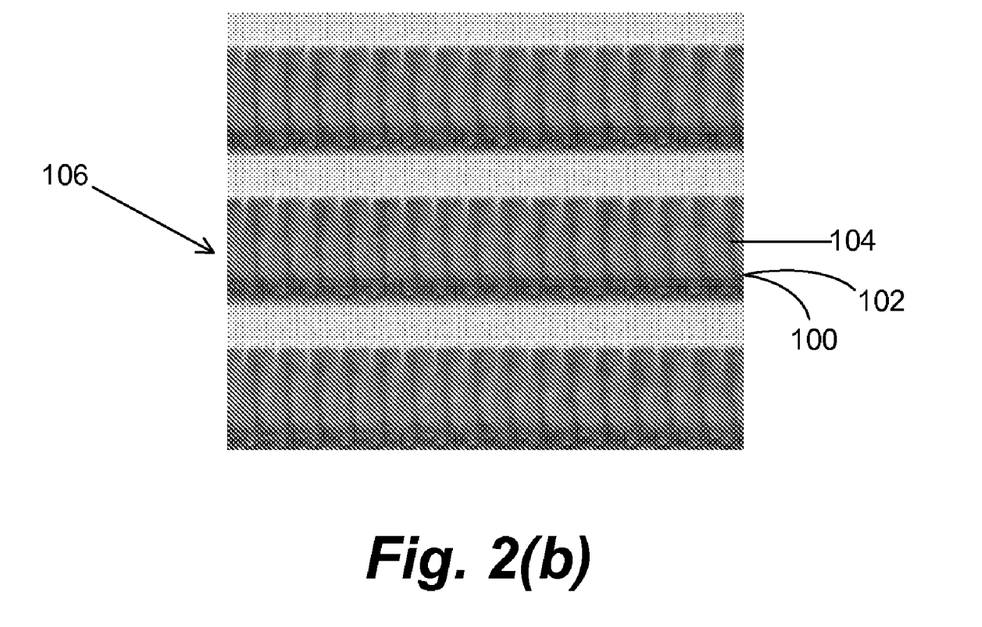

FIGS. 2(a) and 2(b) are stereo-micrographs of the on/off reversible adhesive mechanism according to the preferred embodiment of the present invention, wherein an adhering surface (not shown) would be positioned in a plane above or below the plane of the micrographs.

FIG. 2(a) is a top view of the adhesive mechanism in an "ON" state, with no applied magnetic field, with each of the paddles 100, nanorods 102 and cantilevers 104 in the array 106 facing vertically and parallel to an adhering surface, thereby positioning or engaging the nanorods 102 on the compliant surface of the paddles 100 to the adhering surface.

FIG. 2(b) is a top view of the adhesive mechanism in an "OFF" state, with an applied magnetic field rotating each of the paddles 100, nanorods 102 and cantilevers 104 in the array 106 sideways or substantially orthogonal to an adhering surface, thereby concealing, removing or disengaging the nanorods 102 on the compliant surface of the paddles 100 from the adhering surface.

Thus, the nanorods 102 on the compliant surface of each paddle 100 are rotated to a position substantially orthogonal to an adhering surface (in a plane above or below the plane shown in the micrograph) with application of magnetic field, and are rotated to a position substantially parallel to an adhering surface without application of the magnetic field (or with a magnetic field of insufficient strength to move the structure).

In other words, the adhesion of the mechanism is controlled or changed, i.e., switched on or off, or enhanced or decreased, by moving the compliant surface of the paddles 100, wherein the compliant surface of the paddles 100 may be moved, for example, by applying, weakening or eliminating a magnetic field, either to engage the nanorods 102 with the adhering surface or to remove the nanorods 102 from the adhering surface.

Thus, in its most general form, FIGS. 1(a)-(d) and 2(a)-(b) illustrate how the present invention comprises a synthetic on/off reversible adhesive mechanism having a surface that changes shape to change adhesion or other surface properties, wherein the changing shape may be achieved by applying a magnetic field of varying strength.

Fabrication

Figure 3:
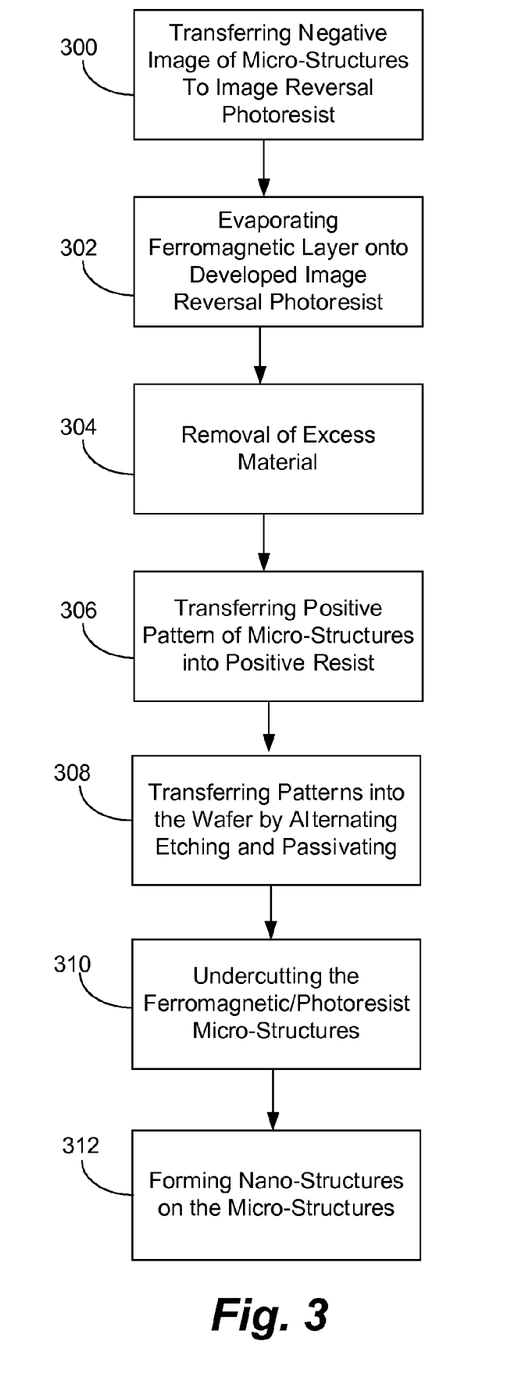
FIG. 3 is a flowchart illustrating a method of fabricating the reversible adhesive.

Fabrication of these multi-scale hierarchical structures, for example, as a MEMS device, requires the integration of two different processing modalities, as shown in the flowchart of FIG. 3. The micro-structures are photolithographically defined and etched using standard micro-fabrication reactive ion etching. The nano-structures are created through a stochastic growth method. Both methods employ batch fabrication techniques and scalable for production quantities.

For example, released 150 nm thick and 130 µm long nickel structures, coated with aligned vertical arrays of stiff polymeric nanorods ~200 nm in diameter and ~3 µm tall, were fabricated using a combination of compatible massively parallel fabrication techniques. The fabrication process began by coating blank 4-inch (100) silicon wafers with a 1.4 µm thick layer of image reversal photoresist (for example, AZ 5214). The negative image of the desired structures was then transferred into the resist across the entire wafer using a Karl Suss MA6 contact aligner (Block 300). After developing, a 150 nm thick nickel layer was electron beam evaporated onto the entire wafer (Block 302). The photoresist was then removed, via an ultrasonic acetone bath, lifting off the excess nickel (Block 304). The wafer was cleaned and dried and a 7 µm layer of photoresist was spun onto the wafer surface (for example, Shipley SPR 220-7). The positive pattern of the structures was then transferred into the resist, aligned with the nickel platforms below (Block 306). The resist and nickel pattern was transferred into the exposed silicon alternating between a highly reactive mostly isotropic $SF_6$ etch and a $C_4F_8$ passivation deposition (the Bosch process) effectively etching vertically into the silicon (Block 308). After etching approximately 30 µm into the silicon, a sustained $SF_6$ etch was performed to undercut the nickel/photoresist structures (Block 310). The released structures were then placed in oxygen plasma with an applied bias between wafer and plasma, creating ~200 nm diameter nanorods, orthogonally to the surface, with an aspect ratio of ~15, as shown in FIGS. 1(a)-(d) and Block 312 of FIG. 3.

This example is only intended to be illustrative, for example, and the thicknesses, dimensions, photoresists, equipment, etching materials and methods can be varied as desired. Moreover, ferromagnetic or magnetic materials other than nickel may be used, although preferably a metal which can be easily deposited in a standard microfabrication facility should be used. Wafers other than silicon might also be used, if they can be easily microprocessed.

Adhesion Testing

Figure 4:
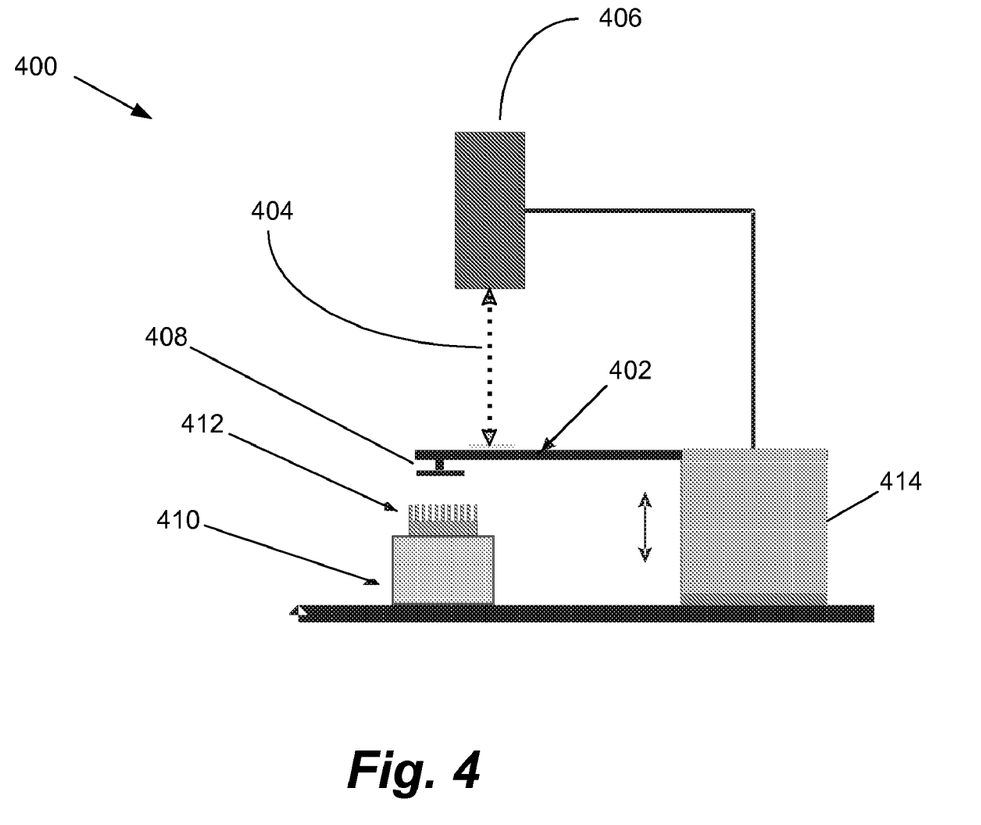
FIG. 4 is a schematic of the adhesion test apparatus, wherein a laser interferometer monitors the deflection of a glass cantilever spring as a piezo electric actuator moves a 5 mm glass flat punch into and away from the test surface, and the interaction forces are calculated by relating the stiffness and deflection of the cantilever upon contact with the surface.

The structures were characterized using an adhesion test apparatus 400, as shown in the schematic of FIG. 4. The basic operating principle of the system is similar to an atomic force microscope, but implemented on a larger scale: the deflection of a cantilever 402 is monitored, using laser interferometry 404 (using a laser interferometer 406), to determine the forces applied to a tip of a probe 408. In this work, a custom 5 mm flat-punch glass probe 408 was manufactured. In order to insure proper alignment between the flat-punch probe 408 and the sample stage 410, the probe 408 was attached to the cantilever 402 using the test apparatus 400. The flat punch 408 was placed flat on the sample stage 410, and the cantilever 402 affixed to its holder. A drop of high-strength glue was placed on the cantilever tip and the sample stage 410 was raised, just bringing the flat-punch 408 and cantilever 402 into contact. The glue was then allowed to cure overnight, before commencing with testing.

Test samples 412 were placed on the micropositioning stage 410 and moved to near contact with the test probe 408. The probe 408 was then lowered using a piezo electric actuator 414, and proper probe/sample alignment was ensured through a horizontally oriented stereomicroscope. Actuation of the probe 408 and data collection was performed using an automated NATIONAL INSTRUMENTS LABVIEW™ program. The program simultaneously moved the probe 408 towards the surface of the test sample 412 and monitored the deflection of the cantilever 402. Through calibration of the cantilever 402 (spring constant, k=137.1 N/m), it was possible to determine the interaction forces between the flat punch probe 408 and the test surface. Upon withdrawal from the surface, adhesion would produce a characteristic pull-off event, evident in a negative dip of the force-displacement curve 500, as shown in the inset 502 of FIG. 5. The reversible adhesive was tested with and without a Neodymium Iron Boron ($Nd_2Fe_{14}B$) rare earth metal magnet below the silicon chip.

Thus, FIG. 4 illustrates a method for measuring adhesion in a microfabricated synthetic adhesive, comprising the step of measuring a deflection of a cantilever 402 using laser interferometry 404, to determine forces applied to the tip of a probe 408 attached to the cantilever 402 and in contact with a synthetic adhesive 412.

Results and Discussion

Biology has relatively few structural materials at its disposal (beta-keratin in the case of the gecko setae and spatulae), thus requiring intricate geometries to create functionality. However, while current micro- and nano-fabrication techniques are limited by the 3-dimensional shapes it is possible to create, the range of available engineering materials is vast. By using engineering materials, otherwise not available to biology, it may be possible to mimic the functionality of some biological systems. Here, in this work, a combination of photoresist, silicon and nickel was used to create a 3-dimensional structure actuated through the application of a magnetic field.

The stress mismatch between the photoresist and nickel causes the cantilevers to bend away from the surface. The upwards bend of these beams gives added compliance to an adherent rough surface, by allowing individual cantilevers to bend and conform long before the adherent surface makes contact with the rigid adhesive substrate. In addition, the upwards bending of the beams isolates the active portion of the adhesive from the substrate.

With the active portion of the adhesive isolated, the properties of the adhesive could then be controlled by actuating the platforms. High-aspect-ratio (e.g., greater than 1) ferromagnetic structures have been shown to rotate within a magnetic field to align their long axis with the magnetic field vector (18). When the structures were placed on top of a permanent magnet the platforms were observed to rotate about their long axis, as shown in FIGS. 2(a)-(b). This rotation is attributed to the preferential alignment of the long axis of the width of the pad in the magnetic field. This rotation reduces the contact area, as evident in the stereo-micrographs in FIGS. 2(a)-(b).

Figure 5:
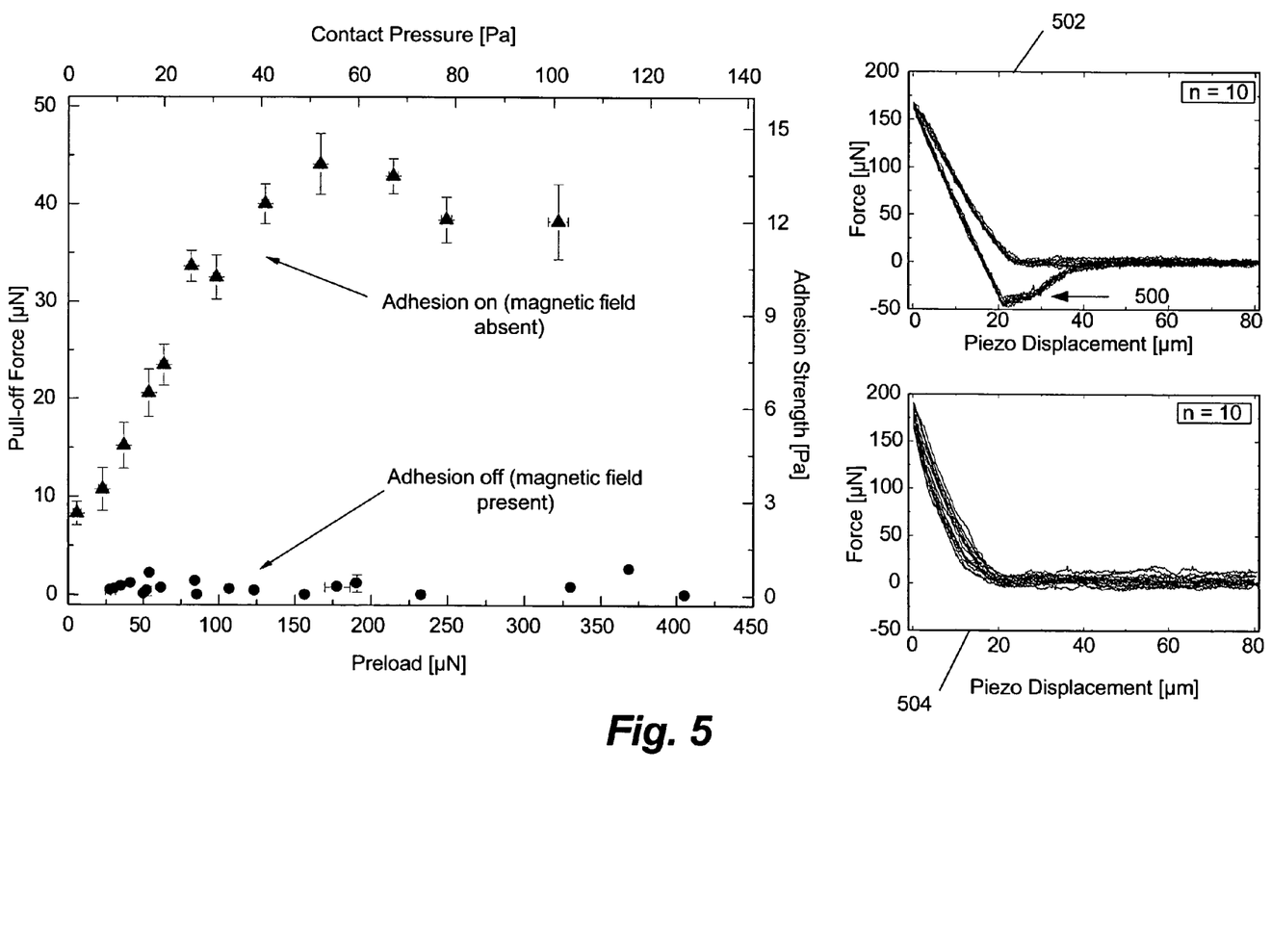
FIG. 5 shows plots of adhesion results, illustrating the on/off behavior of the structures without and with an applied magnetic field, respectively.

Adhesion testing of the structures, without an applied magnetic field, produced unloading curves with a characteristic pull-off event 500 shown in the insets 502, 504 of FIG. 5. The pull-off force was observed to vary with the maximum applied normal load (due to slight misalignments between the flat punch and the test surface) until a saturation adhesion strength of ~14 Pa was observed (obtained by dividing the adhesion force by the projected area of the pad surfaces), as shown in FIG. 5. In the 'ON' state, the devices showed an initial increase in adhesion with preload force, characteristic of increased surface contact with applied load (likely a result of slight misalignment between the 5 mm flat punch and test surface). Error bars represent 10 data sets at a specified displacement with no omission of outlier data points.

Alignment issues, surface inconsistencies and unknown probe geometries have presented difficulties in quantification of non-pressure-sensitive-adhesives. One suggested metric is to simply divide the adhesion force by the maximum preload force, $\mu'=F_{adhesion}/F_{normal}$, thus distinguishing these systems from pressure sensitive adhesives (19). In the system described here, the maximum $\mu'$ value was found to be 1.47+/−0.4, occurring at the minimum detectable level of adhesion (limited by the noise level of the instrumentation). This value offers a substantial increase from previous synthetic work, where Northen and Turner reported $\mu'=0.125$ (17), and Geim et al. $\mu'=0.06$ (20), but still falls short of the gecko with $\mu'=8$ to 16 (19).

In contrast to the adhesion seen in a rest state, the application of a magnetic field to the structures produced a catastrophic loss of adhesion, as shown in FIG. 5. No measurable adhesive events were observed under any tests performed. This complete reduction in adhesion is attributed to the concealing of the nanorod-coated platforms from the test probe. The rotation leaves the edge of the platforms facing in the normal direction and the "sticky" face to the side, making it possible to 'turn a cheek' to an undesired adhering surface.

Additionally, an increase in surface stiffness was seen in the structures with an applied magnetic field. The twisting of the cantilevers increases the second moment of area of the structures, relative to the indenting tip, increasing the stiffness and consequently reducing the compliance of the system. Although not a primary factor in the reduction of adhesion, reduction in compliance of the system may serve to reduce one of the hierarchical effects of this multi-scale adhesive.

Figure 6A:
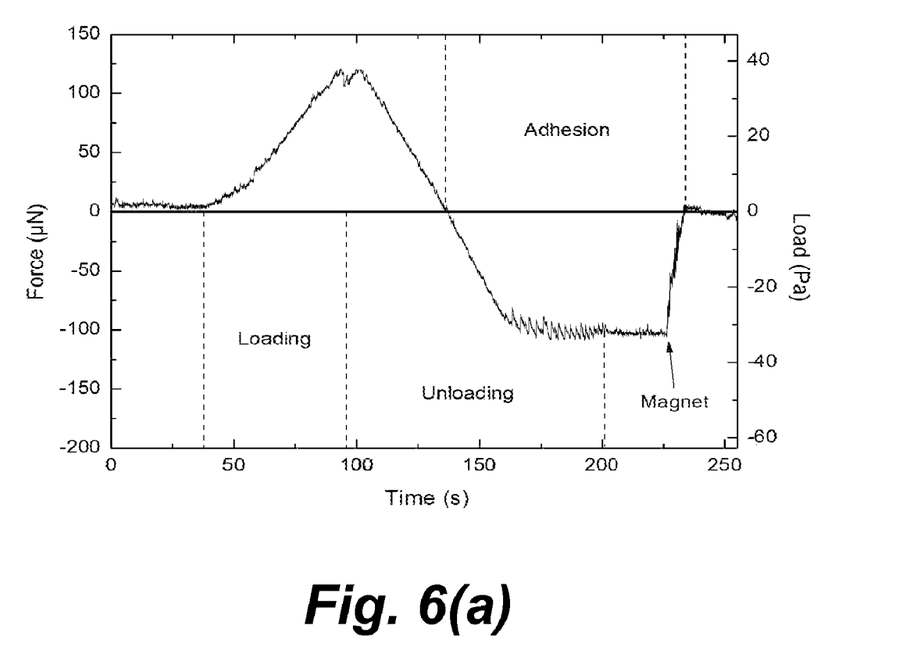
FIGS. 6(a) and 6(b) show plots of adhesion results, illustrating the release of the probe by the test surface.
Figure 6B:
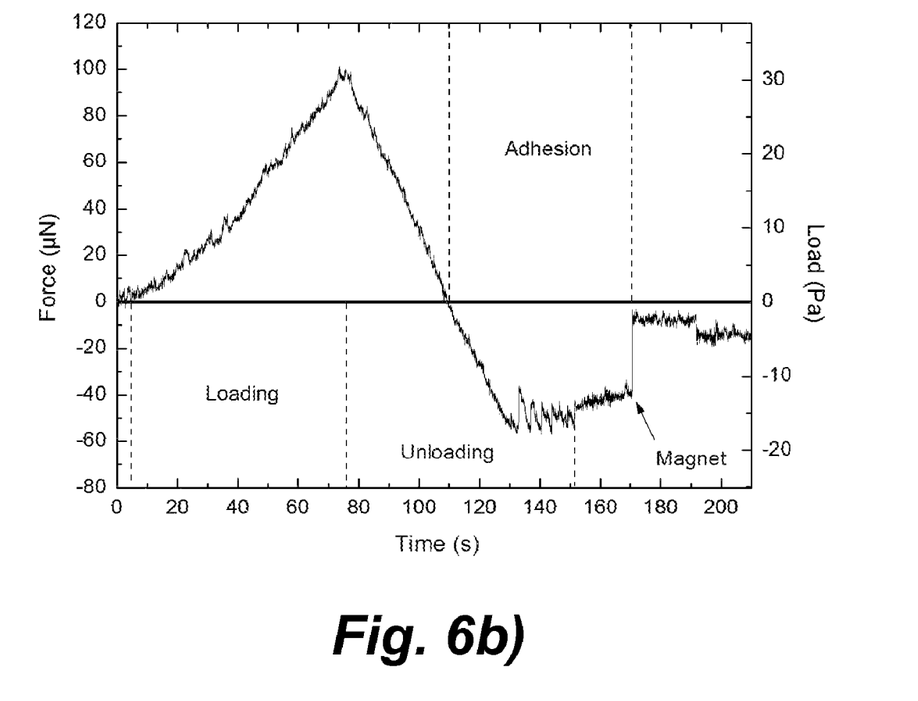

To test the reversible nature of the adhesive, the test probe was brought into contact with the adhesive surface monitoring the increase in load with time, as shown in FIG. 6. The probe was then retracted from the surface, showing a decrease in normal load until the surface moved into the negative adhesive regime. At an arbitrary adhesive value the probe retraction was ceased, and either a $Nd_2Fe_{14}B$ magnet was moved under the sample stage (FIG. 6(*a*), or an electromagnet (doubling as a sample stage) was energized (FIG. 6(*b*)), inducing a magnetic field. In either case, repeatable catastrophic reduction in adhesion was observed, as illustrated in FIG. 6.

In other words, while the probe was stuck to the adhesive surface, a magnetic field was applied. The application of the magnetic field caused a complete reduction of adhesion, causing the probe to unstick from the test surface. This shows that the adhesive can be turned off, e.g., caused to unstick, while sticking to a surface. This has obvious applications in microrobotics as an enabling technology to allow robots to walk up vertical or inverted surfaces, by sticking and then unsticking from the surface with each step. Control experiments showed neither magnetic field had an effect on the glass cantilever and test probe.

Advantages and Improvements over Existing Practice

The present invention is significant in that it represents the major advancement in this multidisciplinary field—combining biologists, material scientists, physicists, chemists surface scientists, nanoscientists and mechanical engineers—directed towards making an adhesive that can be turned on and off (i.e., is reversible). Indeed, this is the first synthetic reversible adhesive.

Currently, all other (published) efforts in this area are still focused on mimicking the structure to make something sticky. Leading researchers in this field agree that this system is not primarily interesting because of the possibility of making a sticky surface (we already have very sticky tapes and glues), but is interesting because of the opportunity to make a surface controllably sticky (to switch a surface from sticky to not sticky and back).

Achieving reversible adhesion will open many technological doors. For example, a company, enabled by the present invention could develop micro/milli-robots able to climb any surface, for example, vertical surfaces. Applications could range from extraterrestrial exploration (on the surface of Mars, for example), to pipeline inspection and search and rescue in harsh environments such as in burning buildings. This may seem like fairly niche applications, but the limiting factor in microrobotics is the ability to traverse rough terrain. Using a reversible adhesive the robot could climb over anything.

Another application could be in fabrication, e.g., rapidly handling sensitive microchips in a fab environment. Chips could be manipulated, grasping and releasing, with no residual glue or other effects. This paradigm could be applied to all kinds of manufacturing. If objects could be lifted and moved by any surface, manufacturing practices could be moved into three dimensions, not solely reliant on gravity and grasping to manipulate objects.

A more common everyday application could be a new class of ubiquitous latching systems, for example, in laptops, or a mug that sticks and unsticks from the dash of your car. Other examples comprise car doors that seal and latch all the way around the perimeter, cabinet or refrigerator doors that close tightly and are therefore sealed and latched, or more generally, simply an active adhesive that you can turn on and off. For example, sticking a painting to the wall and have it stick, but when taking it down, turning off the adhesive so the paint stays on the wall. Or a light that can be stuck to a table, to a wall, to a ceiling, to the hood of a car, and then taken off by simply turning off the adhesive.

REFERENCES

The following references are incorporated by reference herein:

1. Aristotle, *Historia animalium translated by Thompson, D'A. W.* (Oxford, The Clarendon Press, 350 B.C.E. (1918)), p. 584.

2. K. Autumn et al., Adhesive Force of a Single Gecko Foot Hair, Nature 405, p. 681 (2000).

3. K. Autumn et al., Evidence for Van Der Waals Adhesion in Gecko Setae, *Proc. Natl. Acad. Sci. USA* 99, p. 12252 (Sep. 17, 2002, 2002).

4. G. Huber et al., *PNAS* 102, p. 16293 (2005).

5. W. Sun, P. Neuzil, T. S. Kustandi, S. Oh, V. D. Samper, *Biophys. J.* 89, L14 (2005).

6. B. N. J. Persson, S. Gorb, The Effect of Roughness On the Adhesion of Elastic Plates with Application to Biological Systems, *Journal of Chemical Physics* 119, p. 11437 (2003).

7. C. Y. Hui, N. J. Glassmaker, T. Tang, A. Jagota, *Journal of the Royal Society London Interface* 1, p. 35 (2004).

8. E. Arzt, S. Gorb, R. Spolenak, From Micro to Nano Contacts in Biological Attachment Devices, *Proc. Natl. Acad. Sci USA* 100, p. 10603 (2003).

9. M. Scherge, S. Gorb, Biological Micro- and Nanotribology: Nature's Solutions, (Springer, Berlin, 2001).

10. R. Ruibal and V. Ernst, The Structure Of the Digital Setae Of Lizards, *Journal of Morphology* 117, p. 271 (1965).

11. U. Hiller, *Z. Morph. Tiere* 62, p. 307 (1968).

12. A. P. Russell, *Journal of Zoology London* 176, p. 437 (1975).

13. E. E. Williams and J. A. Peterson, Convergent and Alternative Designs in the Digital Adhesive Pads of Nanoscale Fibrillar Structures, *Science* 215, p. 1509 (1982).

14. H. J. Gao, X. Wang, H. M. Yao, S. Gorb, E. Arzt, *Mechanics of Materials* 37, 275 (February-March 2005).

15. R. Spolenak, S. Gorb, E. Arzt, Adhesion Design Maps for Bio-inspired Attachment Systems, *Acta BIOMATERIALIA* 1, p. 5 (2005).

16. H. Gao, and H. Yao, Shape Insensitive Optimal Adhesion of Nanoscale Fibrillar Structures, *Proc. Nat. Acad. Sci. U.S.A.* 101, p. 7851 (2004).

17. M. T. Northen, K. L. Turner, A Batch Fabricated Biomimetic Dry Adhesive, *Nanotechnology* 16, p. 1159 (2005).

18. J. Judy, R. Muller, H. H. Zappe, *Journal of Microelectromechanical Systems* 4, p. 162 (1995).

19. K. Autumn, in *Biological Adhesives* A. S. a. J. Callow, Ed. (Springer Verlag, 2006).

20. A. K. Geim, S. V. Dubonos, I. V. Grigorieva, K. S. Novoselov, A. A. Zhukov, Microfabricated Adhesive Mimicking Gecko Foot-hair, *Nature Materials* 2, p. 461 (2003).

21. Full, et al., Adhesive microstructure and method of forming same, U.S. Pat. No. 6,737,160, May 18, 2004.

22. Sitti M and Fearing R, Synthetic Gecko Foot-hair micro/nano structures as dry adhesives, *J. Adhesion Sci. Technol.* 18 1055-74 (2003).

Conclusion

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An adhesive, comprising:
a compliant surface having one or more nano-structures thereon, wherein the compliant surface is moved by applying a magnetic field either to engage the nano-structures with an adhering surface or to remove the nano-structures from the adhering surface.

2. The adhesive of claim 1, wherein the compliant surface is a paddle situated at one end of a cantilevered beam.

3. The adhesive of claim 1, wherein the compliant surface is a platform supported by a pillar.

4. The adhesive of claim 1, wherein the compliant surface is moved in order to control an amount of the compliant surface's area that is available for adhesion.

5. The adhesive of claim 1, wherein adhesion of the adhesive is enhanced or decreased by moving the compliant surface.

6. The adhesive of claim 1, wherein the compliant surface changes shape to control adhesion.

7. The adhesive of claim 1, wherein the nano-structures are polymer nanorods.

8. The adhesive of claim 1, further comprising an array of compliant surfaces having nano-structures thereon.

9. The adhesive of claim 8, wherein the array of the compliant surfaces comprises a microelectromechanical system (MEMS) device.

10. A method for fabricating an adhesive, comprising:
fabricating one or more nano-structures on a compliant surface, such that the nano-structures are positioned to an adhering surface or the nano-structures are removed from the adhering surface, when the compliant surface is moved by applying a magnetic field.

11. A synthetic reversible adhesive having a surface that changes shape by applying a magnetic field to control adhesion, wherein the surface includes one or more nano-structures thereon that perform an adhesive function, and the surface changes shape either to engage the nano-structures to an adhering surface or to dis-engage the nano-structures from the adhering surface.

* * * * *